(12) United States Patent
Mizushima et al.

(10) Patent No.: US 6,459,644 B2
(45) Date of Patent: Oct. 1, 2002

(54) SEMICONDUCTOR MEMORY DEVICE WITH BLOCK ALIGNMENT FUNCTION

(75) Inventors: Nagamasa Mizushima, Fujisawa; Kunihiro Katayama, Chigasaki; Kazunori Furusawa, Koganei; Tomihisa Hatano, Yokohama; Takayuki Tamura, Higashiyamato, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/779,610

(22) Filed: Feb. 9, 2001

(30) Foreign Application Priority Data

Jun. 6, 2000 (JP) .......................................... 2000-169289

(51) Int. Cl.[7] .................................................. G11C 8/00
(52) U.S. Cl. ............. 365/230.01; 365/218; 365/230.03; 365/238.5; 365/185.11
(58) Field of Search ................. 365/230.01, 230.06, 365/230.03, 218, 238.5, 185.11

(56) References Cited

U.S. PATENT DOCUMENTS

| 5,598,370 A | | 1/1997 | Niijima et al. | |
|---|---|---|---|---|
| 5,630,093 A | * | 5/1997 | Holzhammer et al. | 395/442 |
| 5,734,816 A | * | 3/1998 | Niijima | 395/182.06 |
| 5,889,795 A | * | 3/1999 | Niijima | 371/40.4 |
| 5,937,423 A | * | 8/1999 | Robinson | 711/103 |
| 6,145,051 A | * | 11/2000 | Estakhri et al. | 711/103 |

FOREIGN PATENT DOCUMENTS

| EP | 0477503 | | 8/1991 |
|---|---|---|---|
| EP | 0 896 280 A2 | | 2/1999 |
| JP | 402189767 A | * | 7/1990 |
| JP | 408286840 A | * | 11/1996 |
| JP | 10-124384 | | 5/1998 |
| JP | 11-110283 | | 4/1999 |
| JP | 02000293959 A | * | 10/2000 |
| WO | 97/10604 | | 3/1997 |
| WO | 99/08177 | | 2/1999 |

* cited by examiner

Primary Examiner—Viet Q. Nguyen
(74) Attorney, Agent, or Firm—Mattingly, Stanger & Malur, P.C.

(57) ABSTRACT

In the present invention, disclosed is a semiconductor memory device capable of reducing the number of erasing times of each block allocated to a cluster or the number of blocks to be erased in one writing to the minimum. As an embodiment of the present invention, when a host system 1 performs accessing, for each cluster as a unit, to the FAT partition prepared on a flash memory 17 of the semiconductor memory device 100, a CPU 6 adds an address offset value held by address offset storage section 10 to a logical address specified by the host system 1, whereby a logical address of a head sector of the cluster correspond to a physical address of a head sector of a unit block for erasing/writing data in the flash memory 17.

9 Claims, 12 Drawing Sheets

FIG.7

| | LOGICAL ADDRESS | OFFSET | PHYSICAL ADDRESS |
|---|---|---|---|
| MBR | 0h | +1 | 1h |
| PBR | 20h | +1 | 21h |
| FAT AREA I | 21h | +1 | 22h |
| FAT AREA II | 24h | +1 | 25h |
| ROUTE DIRECTORY AREA | 27h | +1 | 28h |
| CLUSTER0 | 47h | +1 | 48h |
| CLUSTER1 | 4Fh | +1 | 50h |
| CLUSTER2 | 57h | +1 | 58h |
| CLUSTER3 | 5Fh | +1 | 60h |
| CLUSTER4 | 67h | +1 | 68h |
| ... | ... | | ... |

SEMICONDUCTOR MEMORY DEVICE WITH BLOCK ALIGNMENT FUNCTION

This application claims a priority based on Japanese Patent Application No. 2000-169289 filed on Jun. 6, 2000, the entire contents of which are incorporated herein by reference for all purposes.

BACKGROUND OF THE INVENTION

The present invention relates to a semiconductor memory device, more particularly to a semiconductor memory device using a storage medium which requires data erasion for each predetermined block in writing data thereto.

As an external storage device for such as a portable terminal device, a semiconductor memory device mounting a semiconductor memory has been rapidly spread. In such semiconductor memory device, generally, a flash memory has been used as the semiconductor memory, which is capable of performing simultaneous erasing/rewriting of data electrically, and which is non-volatile, shows low power consumption, and can store a large capacity of data.

With such flash memory, in order to deal with a recent demand for storing a large capacity of data, a flash memory adopting multi-valued structure capable of storing two or more bit data in one cell has been introduced instead of a flash memory adopting a binary-valued structure storing one bit data in one cell.

Since such a flash memory adopting the multi-valued structure can store the two or more bit data in one cell, storage capacity per unit area increases. However, since a cell adopting the multi-valued structure takes more processing time for data erasing/writing than a cell adopting the binary-valued structure, the flash memory adopting the multi-valued structure, the flash memory adopting the multi-valued structure shows lowered writing processing performance than the flash memory adopting the binary-valued structure, in the case that the size of a unit block (hereinafter referred to as an erase block) of the flash memory adopting the multi-valued structure, for erasing/writing of batch data is the same as that of the flash memory adopting the binary-valued structure.

Accordingly, a countermeasure to expand the size of the erase block has been taken. With this countermeasure, the number of times (the number of erase blocks) or erasing/writing batch data simultaneously can be reduced in writing a certain quantity of data, and hence lowering of data processing performance can be prevented.

Furthermore, when the erase block is subdivided and the erase block increase in number, more peripheral circuits coping with the increase of the number of erase blocks is required, and a chip area is expanded as a whole, resulting in a decrease in a yield rate in manufacturing the flash memory. However, the expansion of the chip area is controlled by expanding the size of the erase blocks and by decreasing the number of erase blocks, leading to an improvement of the yield rate.

On the other hand, when a host system reads out file data from such an external storage device and writes it thereinto, the host system generally uses a sector as a unit of access similarly to a hard disc device, or the like. A size of one sector is, for example, 512 bytes.

In the semiconductor memory device which has the flash memory adopting the binary-valued structure, generally, the size of this sector and the size of the erase block are made to be coincident with each other. On the other hand, in the semiconductor memory device which has the flash memory adopting the multi-level structure, the size of the erase block is expanded as described above, and the plurality of sectors are collected into one as the erase block. Thus, when the host system sends a command to the semiconductor memory device so as to write batch data into the plurality of sectors thereof simultaneously, it is possible to erase the batch data from the plurality of sectors and write the data thereinto simultaneously. Therefore, the semiconductor memory device which has the flash memory adopting the multi-valued structure can more shorten the processing time compared to the semiconductor memory device which has the flash memory adopting the binary-valued structure.

Furthermore, when the semiconductor memory devices having the flash memory are used, the host system often executes a file data management according to file allocation table (hereinafter referred to as FAT) file system, which is the commonest as a file management system for the hard disc device.

A partition in which the FAT file system is constructed (hereinafter referred to as a FAT partition) has a management data area (a partition boot record (hereinafter referred to as a PBR) area, a FAT area and the like), which is for storing management data, and a FAT file area for storing file data. The FAT file area among these areas is managed using each cluster composed of the plurality of sectors amounting to 4, 8, 16, 32 sectors in number and the like as a unit.

In a situation where the host system stores the file data in the FAT file area, a writing operation using each cluster as a unit is frequently performed. In the flash memory adopting the multi-valued structure the number K (K: an integer equal to two or more) of the sectors constituting the erase block is normally set to a number so as to be able to divide the number J of the sectors constituting the cluster. Specifically, the number J of the sectors constituting the cluster is equal to K×L pieces (L: a positive integer).

Consideration will be given to the case where the host system allocates FAT partitions onto the flash memory mounted on the semiconductor memory device for managing file data using the FAT file system.

In the semiconductor memory device mounting the conventional flash memory, the host system allocated a logical address, which is used for the host system to manage a sector number, to a physical address having an equal value of the flash memory.

When such an allocation is performed, the following two cases are conceived with respect to a correlation between the cluster and the erase block in the FAT area.

In the case 1, the logical address of a head sector of a cluster and the physical address of a head sector of an eraser block correspond to each other. In the case 2, the logical address of the head sector of the cluster and the physical address of the head sector of the erase block do not correspond to each other.

For example, when the erase block consists of four sectors (K=4) and the cluster consists of eight sectors (J=8, L=2), one cluster consists of eight sectors included in continuous two erase blocks in the case 1 without any surplus or shortage. However, since the head of the cluster and the head of the erase block disagree with each other, one cluster consists of the middle eight sectors among the twelve sectors included in the three continuous erase blocks.

To be specific, in the case 2, the clusters adjacent to each other (hereinafter referred to as clusters A and B) share one erase block (hereinafter referred to as a block M).

Here, among the four sectors constituting the block M, a sector portion included in the cluster A is set as a sector portion X, and a sector portion included in the cluster B is set as a sector Y. When the host system writes data into the cluster A, the data of the sector portion Y is erased as batch data of the block M irrespective of no necessity to rewrite the data of the sector portion Y, and the original data is written thereinto again. Furthermore, also when the host system writes data into the cluster B, the data of the sector portion X is erased as batch data of the block M irrespective of no necessity to rewrite the data of the sector portion X, and the original data is written thereinto again.

Accordingly, when the data is written into each cluster of the FAT file area evenly, the number of times of erasing/writing operations performed for each erase block shared by the clusters adjacent to each other such as the block M must be twice the number of times of erasing/writing operations performed for an erase block included in a single cluster (hereinafter referred to as a block N), and hence a life of a memory element in the block M is reduced by half compared to that in the block N in terms of probability.

Furthermore, though erasing and writing operations for the two erase blocks is necessary to write the data into one cluster in the case 1, erasing and writing operations for the three erase blocks is required to write the data into one cluster in the case 2. Accordingly, the speed of the writing operation is slower compared to that in the case 1.

SUMMARY OF THE INVENTION

The object of the present invention is to provide a semiconductor memory device capable of reducing the number of times of an erasing operation for each block or the number of blocks erased by one writing operation to the minimum.

The semiconductor memory device according to the present invention is accessed by using logical addresses from a host system which divides and manages file data by using clusters each of which is composed of a plurality of sectors and is a unit for dividing a managing, and the semiconductor memory device comprises: a memory section composed of the plurality of sectors, which is capable of erasing data for each block; and a control section for transforming a logical address to a physical address so that the logical address of a head sector of the cluster corresponds to the physical address of a head sector of the block, and for accessing the memory section by using the physical address thus transformed.

In this case, the logical address may be transformed to the physical address by applying an address offset value to the logical address.

A computation of the address offset value may be executed by the use of total storage capacity information of the memory section immediately after beginning power supply.

Furthermore, by the use of information concerning a partition made on the memory section, the computation of the address offset value may be executed when the information concerning the partition is written. The information concerning the partition is, for example, data written into an address "0" of the logical address.

In a file system made on the memory section, the computation of the address offset value may be executed, by the use of management information used to manage the file data, when the management information is written.

The management information is, for example, data written into a logical address range occupied by a management data area of the file system. In a case where a file system is, for example, the FAT file system, the management information is data of the PBR.

An information processing device according to the present invention has a feature in that this device includes the semiconductor memory device as described above.

A host system according to the present invention divides and manages file data by using clusters each of which is composed of a plurality of sectors and is a unit for dividing and managing. When the host system accesses a memory section composed of the plurality of sectors which is capable of erasing data for each block, the host system transforms a logical address to a physical address so that the logical address of a head sector of the cluster corresponds to the physical address of a head sector of the block and accesses the memory section by using the physical address thus transformed

BRIEF DESCRIPTION OF THE DRAWINGS

FIG. 7 is a table showing an example of a correspondence correlation between a logical address and a physical address.

DETAILED DESCRIPTION OF THE PREFERRED EMBODIMENTS

Embodiments of the present invention will be described with reference to the accompanying drawings below.

Figure 1:
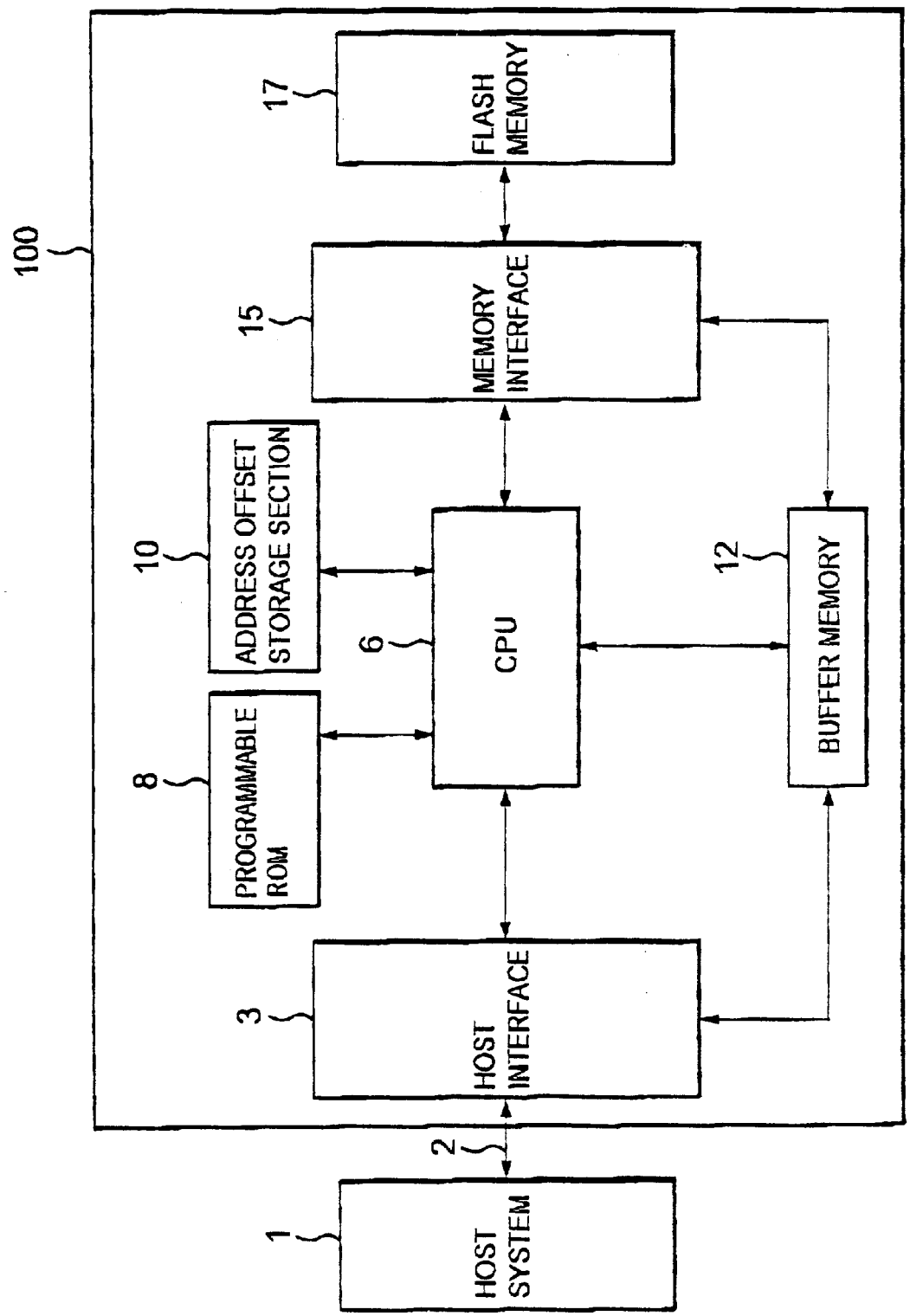
FIG. 1 is a block diagram showing a semiconductor memory device according to the present invention.

FIG. 1 is a block diagram of a semiconductor memory device to which the present invention is applied.

As shown in FIG. 1, the semiconductor memory device 100 according to the present invention comprises: a host interface 3; a central processing unit (hereinafter referred to as a CPU) 6; a programmable read only memory (hereinafter referred to as a programmable ROM) 8; an address offset storage section 10; a buffer memory 12; a memory interface 15; and a flash memory 17. The CPU 6 and the address offset storage section 10 constitute a control section.

Furthermore, the semiconductor memory device 100 is connected to the host system 1 such as a personal computer via a bus 2, and receives a command from the host system 1. Moreover, the semiconductor memory device 100 exchanges data with the host system 1.

The bus 2 is used when the host system 1 accesses to the semiconductor memory device 100, and is, for example, a local bus of the host system 1 or a standard bus of a personal computer such as an Integrated Drive Electronic (IDE) bus, an Industry Standard Architecture (ISA) bus, a Peripheral Component Interconnect (PCI) bus, a Small Computer System Interface (SCSI) bus, a PC card bus, and the like.

The host interface 3 is a hardware which transfers data sent via the bus 2 to the buffer memory 12 and transfers data stored in the buffer memory 12 to the bus 2.

The buffer memory 12 temporarily holds the data read out from the flash memory 17 and the data to be written into the flash memory 17, and comprises, for example, a static RAM (Random Access Memory).

The memory interface 15 is a hardware which transfers the data read out from the flash memory 17 to the buffer memory 12 and writes the data held by the buffer memory 12 into the flash memory 17.

The CPU 6 reads out a program stored in the programmable ROM 8, and performs a operation according to the program. For example, the CPU interprets a command and status of the host system 1 received via the host interface 3, and controls functions of the host interface 3 and memory interface 15 according to the result of interpretation. Furthermore, the CPU 6 reads out the data held in the buffer memory 12, and rewrites the data.

Furthermore, the CPU 6 transforms a logical address designated by the host system 1 to a physical address for accessing the flash memory 17, by the use of an address offset value stored in the address offset storage section 10. A method of computing the address offset value and a method of transforming the logical address to the physical address will be described later.

The address offset storage section 10 stores the address offset value used in transforming the logical address to the physical address, and comprises a non-volatile or volatile memory element. Note that the address offset storage section 10 may be provided as independent storage means or alternatively may be constituted by using a part of other memory such as the flash memory 17.

In the semiconductor memory device 100, the flash memory 17 stores file data and the like.

Figure 2:
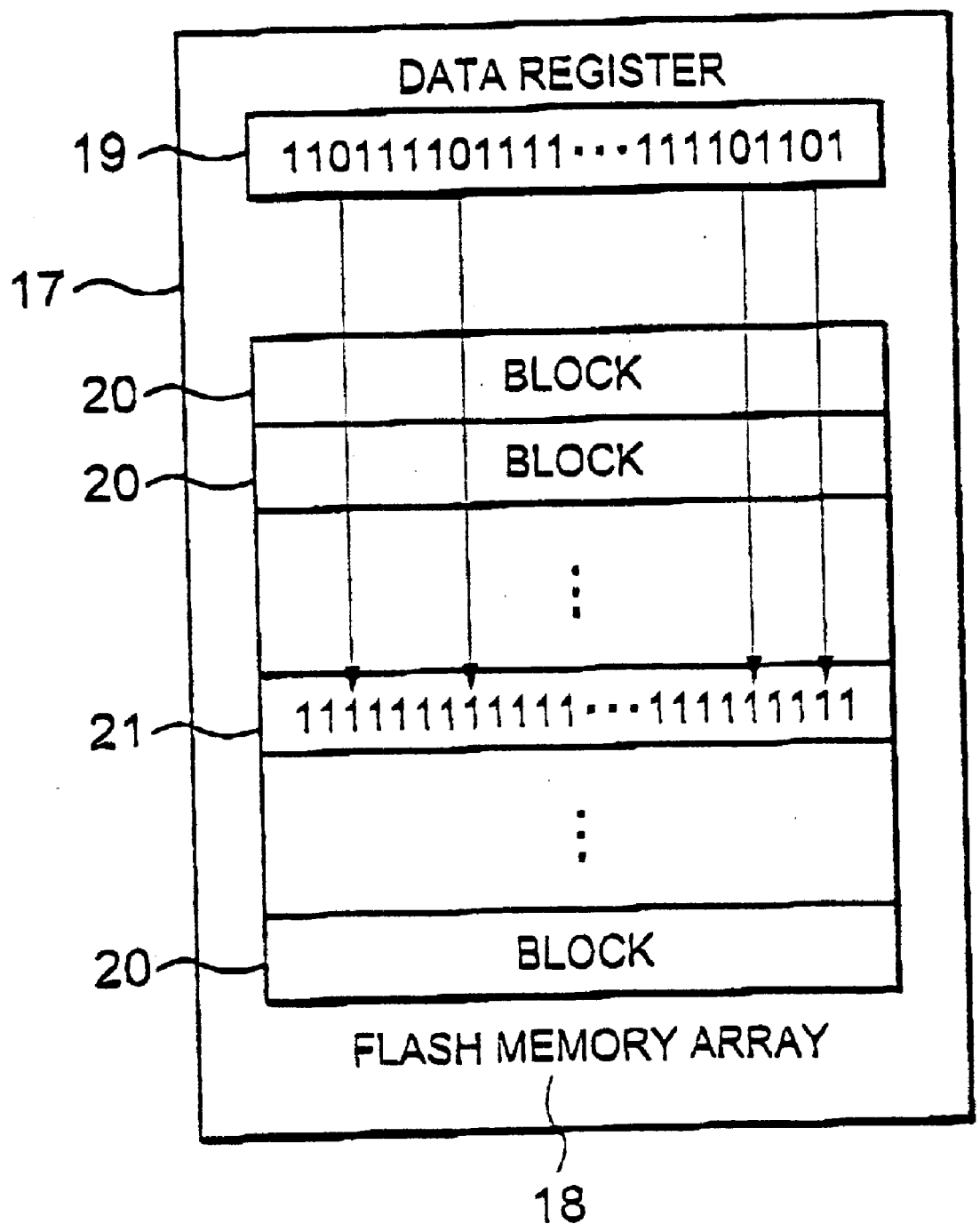
FIG. 2 is a constitutional view showing a constitution of a flash memory.

FIG. 2 is a constitutional view showing a constitution of the flash memory 17.

As shown in FIG. 2, the flash memory 17 comprises a flash memory array 18 and a data register 19.

The flash memory array 18 is an area for storing data, and constituted of a plurality of (erase) blocks 20.

The data register 19 temporarily holds data for reading out data from any of the blocks 20 and for storing the data in any of the blocks 20.

In the flash memory 17 shown in FIG. 2, writing of sector data for the designated physical address is performed in the following manner. All batch data of a block including sectors to which data is to be written is first transferred to the data register 19 of the flash memory 17. Thereafter all data stored in the block of the flash memory array 18 is erased. A bit data of the block falls in an erase state, for example, all bit data becomes "1". Reference numeral 21 of FIG. 2 illustrates a block in the erase state.

Next, among the data held in the data register 19, data of the sector to which data is to be written is rewritten in the data register 19, and all data in the data register 19 is written into the block 21 In the example of FIG. 2, writing is performed by inverting the bit data from "1" to "0" of the block 21 corresponding to the bit data "0" in the data register 19.

Figure 3:
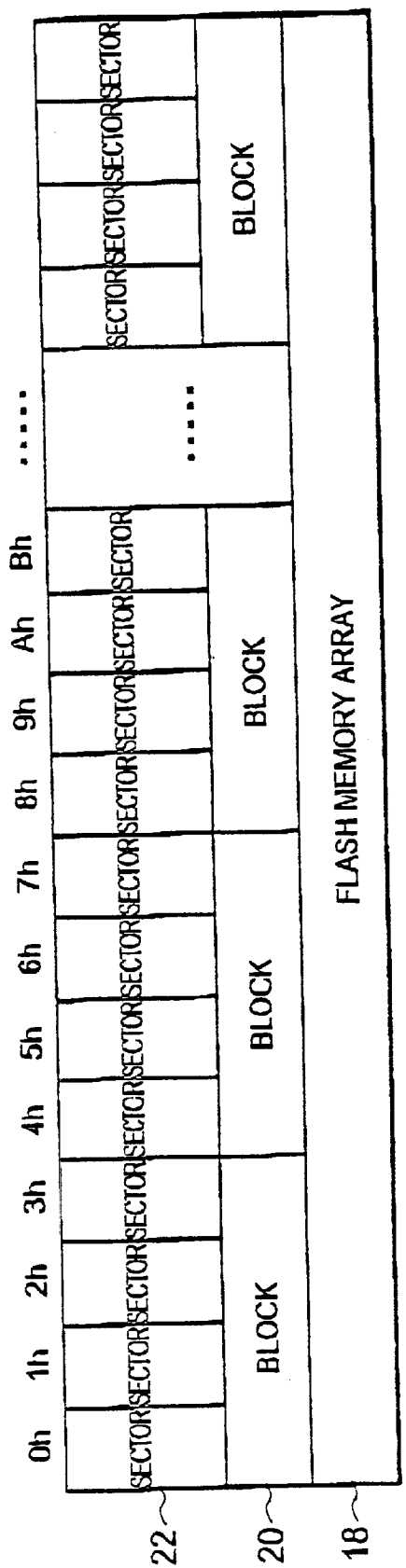
FIG. 3 is a constitutional view showing a constitution of a flash memory array.

FIG. 3 is a constitutional view showing a constitution of a flash memory array 18. As shown in FIG. 3, the flash memory array 18 comprises the plurality of blocks 20, and each of the blocks 20 comprises the four sectors 22, respectively. Note that each block may be comprised by any number of the sectors as long as the number of the sectors is two or more.

The sector 22 functions as a data unit when the host system 1 performs reading-out and writing of data for the semiconductor memory device 100, and having a data unit size of, for example, 512 bytes.

The sectors 22 comprising the flash memory array 18 are numbered in a sequentially ascending order from 0h, respectively, and the sector number is called a physical address.

When the host system 1 performs the reading-out and writing of the data from and to the semiconductor memory device 100, using the sector as a unit, the sector number managed by the host system 1 is called a logical address, which starts from 0h as a starting point. The host system 1 specifies the logical address, and performs reading-out and writing of data from and to the semiconductor memory device 100.

Next, an operation of the semiconductor memory device 100 will be described when the host system 1 issues an instruction to the semiconductor memory device 100 so as to perform writing of data.

When a command for requesting writing of data to the specified logical address is sent from the host system 1 to the semiconductor memory device 100, the CPU 6 acquires the logical address via the host interface 3, and transforms the logical address to the physical address corresponding thereto.

Specifically, the CPU 6 reads out the address offset value stored in the address offset storage section 10, and adds the address offset value to the logical address value, thus generating the physical address.

The writing data transferred from the host system 1 is held in the buffer memory 12 via the host interface 3. The CPU 6 controls the memory interface 15 so that the data in the buffer memory 12 is written into the physical address after the address transformation, and writes the data into the specified physical address of the flash memory 17.

Next, a method of computing the address offset value used for the address transformation will be described.

For the sake of understanding this method in more detail, descriptions for a file system prepared in the semiconductor memory device 100 will be made. A system in which the host system 1 manages file data on the flash memory array 18 of the flash memory 17 is called a file system. The plurality of file systems can be prepared on the flash memory array 18, and a logical address range for placing a certain file system is called a partition.

Here, a case where the FAT file system is adopted as the file system is explained.

Figure 4:
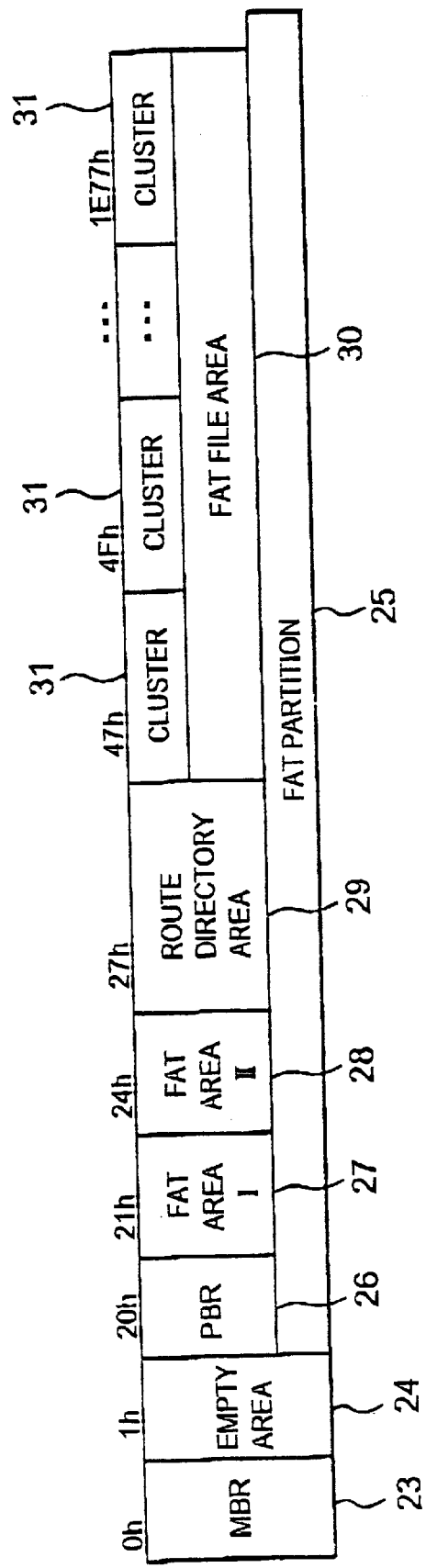
FIG. 4 is a constitutional view showing a constitution of the FAT file system.

FIG. 4 is a constitutional view showing a constitution of the FAT file system. FIG. 4 shows an example in which one FAT partition 25 is prepared on the flash memory 18. The FAT partition 25 is a partition occupied by the FAT file system.

In FIG. 4, the logical address range of the FAT partition 25 covers from 20h to 1E7Fh. The FAT partition 25 comprises a PBR 26, a FAT area I 27, a FAT area II 28, a route directory area 29 and the FAT file area 30.

The PBR 26 is a data stored in a head logical address of the FAT partition 25. In FIG. 4, the logical address of the PBR 26 is 20h. In the PBR 26, included is information from which the logical address ranges of the FAT area I 27, FAT area II 28, route directory area 29 and FAT file area 30 of the FAT partition 25 can be known, respectively.

The FAT file area 30 is an area for storing file data. In FIG. 4, the logical address range of the FAT file area 30 covers from 47h to 1E7Fh.

The host system 1 manages the FAT file area 30 using clusters 31 each of which is a unit for managing, and writes file data into the FAT file area 30 using clusters 31 each of which is a unit for writing.

Here, each cluster 31 shall be composed of eight sectors 22. Note that the number of the sectors 22 constituting the cluster 31 may be any number as long as it is natural number-times of the number of the sectors 22 constituting the block 20.

The FAT area I 27 is an area for storing table data indicating a usage state of each of the clusters 31. In FIG. 4, the logical address range of the FAT area I 27 covers from 21h to 23h.

The FAT area II 28 is an area for storing a copy of data of the FAT area I 27. In FIG. 4, the logical address range thereof covers from 24h to 26h.

The route directory area 29 is an area for storing data indicating information pertaining to a file and a sub-directory in a route directory of the FAT partition 25. In FIG. 4, the logical address range thereof covers from 27h to 46h.

When the host system 1 prepares a file system on the semiconductor memory device 100, the host system 1 first allocates a partition to an empty logical address range on the flash memory array 18. In this case, the empty logical address range means a logical address range to which another partition is not allocated. Then, the host system 1 formats this partition. The word "format" means that the logical address ranges of the PBR 26, FAT area I 27, FAT area II 28 and route directory area 29 are allocated onto the partition and initialization data for managing file data is written into these areaa.

A master boot record (hereinafter referred to as MBR) 23 is data stored in the logical address 0h. Within a logical address range in which the host system 1 can store file data, the MBR 23 includes information indicating the logical address range of each of the partitions and sorts of the file systems existing in the logical address range. The host system 1 rewrites the data of the MBR 23 when the host system 1 performs the allocation of the partition to the empty logical address range, the format of the partition, deletion of the existing partition and the like.

When the FAT file system as described above is prepared in the semiconductor memory device 100, the CPU 6 computes an address offset value that satisfies the following conditions. To be specific, the address offset value serves so as to make a head logical address of the FAT file area 30 correspond to a physical address of a head sector of a certain block 20 when the address offset value is added up. By computing the address offset value satisfying the above conditions, the destination of the logical address of the head sector of each cluster 31 which constitutes the FAT file area 30 always agrees with the physical address of the head sector of the corresponding one of the blocks 20.

Figure 5:
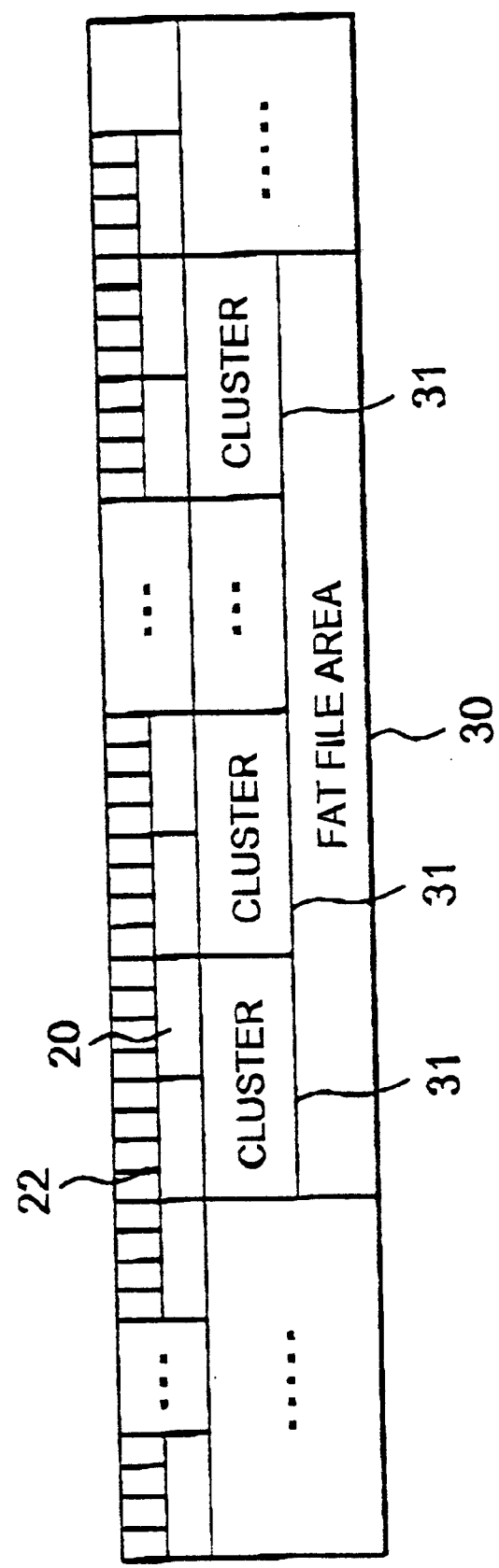
FIG. 5 is a view illustrating a relation between a cluster and a block in the FAT file area disposed on the flash memory array.

FIG. 5 is a view illustrating a correlation between a block 20 of the flash memory 17 and a cluster 31 in a FAT file area 30 under the above-described conditions. FIG. 5 shows a case where the block 20 consists of four sectors and the cluster 31 consists of eight sectors. Each of the clusters 31 consists of just two blocks 20.

With such constitution, the data of the sector which is not included in the cluster to which the data is written is never erased in writing process using a cluster as a unit for writing. Accordingly, effects can be achieved, in which the foregoing problem of reducing the life of the memory element can be solved and the number of the blocks to which the data is written for each cluster becomes minimum, thus shortening the processing time.

Figure 6:
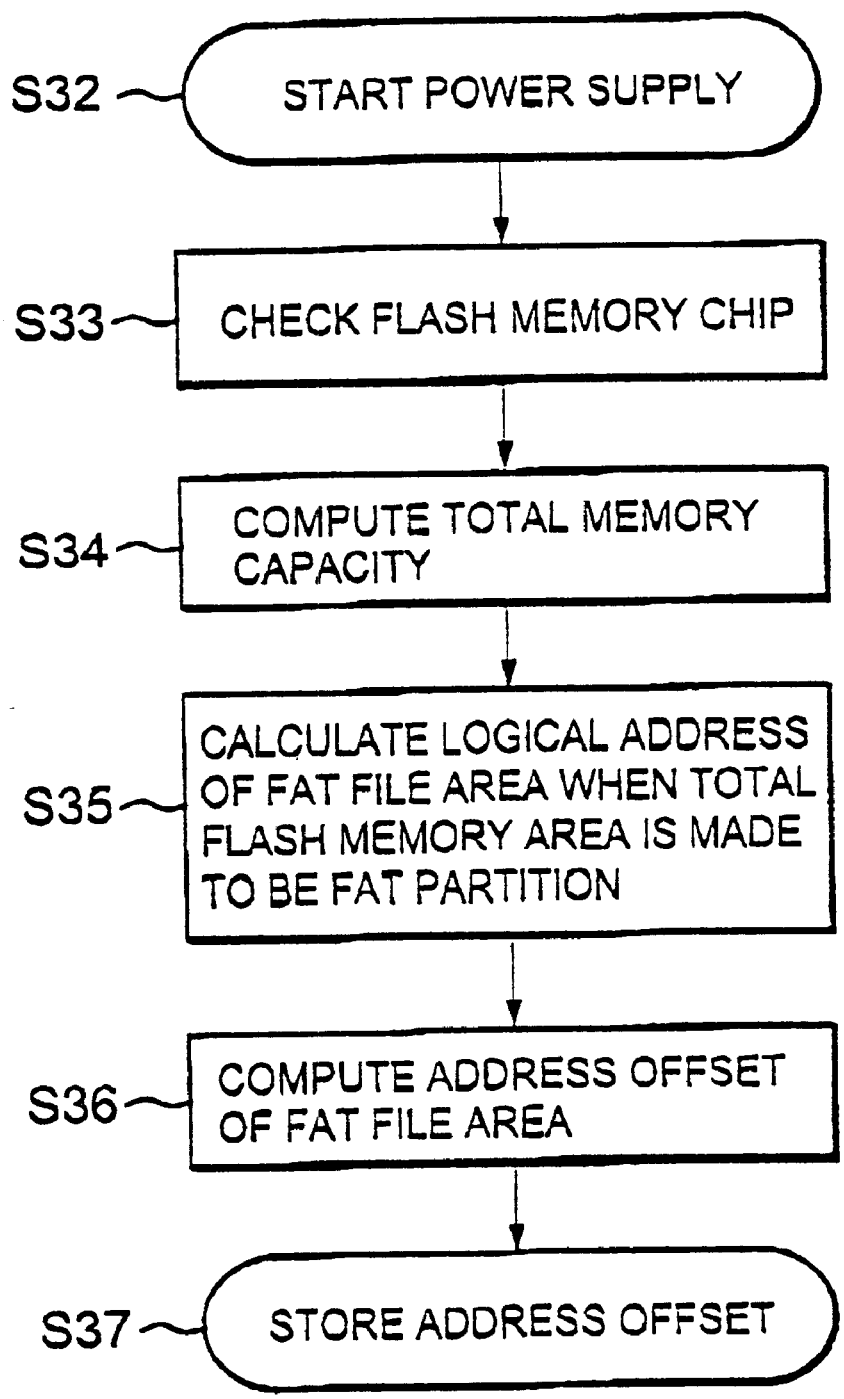
FIG. 6 is a flowchart of a first address offset setting processing.

Subsequently, the details of an address offset setting processing for computing the address offset value will be described. FIG. 6 is a flowchart of the address offset setting processing.

When power supply to the semiconductor memory device 100 starts (S32), the CPU 6 first checks the number of memory chips constituting the flash memory 17 and a capacity of each of the memory chips (S33). Checking is carried out by reading out, for example, capacity information from each memory chip.

Then, the total of the memory capacity capable of preparing the file system in the flash memory 17 is computed (S34). Next, when one FAT partition 25 is prepared using the total of the computed memory capacity, computed is the logical address range occupied by the PBR 26, the FAT area I 27, the FAT area II 28 and the route directory area 29, and a starting logical address value of the FAT area 30 is calculated (S35).

Subsequently, it is decided whether a sector having a value, equal to the starting logical address value, as a physical address, is a head address of a block. If the sector is not the head address of the block, the starting logical address value is subtracted from a physical address value of a head sector of each block following the block concerned, and an address offset value is computed (S36). The computed address offset value is stored in the address offset storage section 10 (S37).

Thereafter, the CPU 6 transforms the logical address specified by the host system 1 to the physical address having a value obtained by adding the address offset value stored in the address offset storage section 10 to this logical address, and accesses the flash memory 17 using the physical address thus transformed.

FIG. 7 shows an example of correlation between logical addresses of the head sectors of the MBR 23, the areas 26 to 30 of the FAT partition and the head sectors of clusters 31, and physical addresses corresponding to them, when the host system 1 allocates all flash memory areas to one partition and formats this partition by the FAT.

In this case, since the block 20 consists of four sectors, a sector having the physical address whose value is a multiple of four is a head sector of the block 20. Since a sector having the physical address whose value is equal to the head logical address 47h of the FAT file area 30 is not the head sector of the block 20, for example, "1" obtained by subtracting the physical address value 47h from the physical address value 48h of the head sector of the next block 20 is set as the address offset value.

By adding "1" that is the address offset value to the logical address, the head logical address of each cluster 31 constituting the FAT file area 30 is transformed so as to correspond to the physical address of the head sector of the block 20. Accordingly, the above described conditions of the address offset value are satisfied. Although, in the embodiment, the address offset value is applied to the whole of the logical address range, the address offset value may be applied to any range as long as the address offset value is applied at least to the logical address range occupied by the FAT file area 30.

Next, a second address offset setting processing which can be applied to the present invention similarly to the foregoing address offset setting processing will be described.

Figure 8:
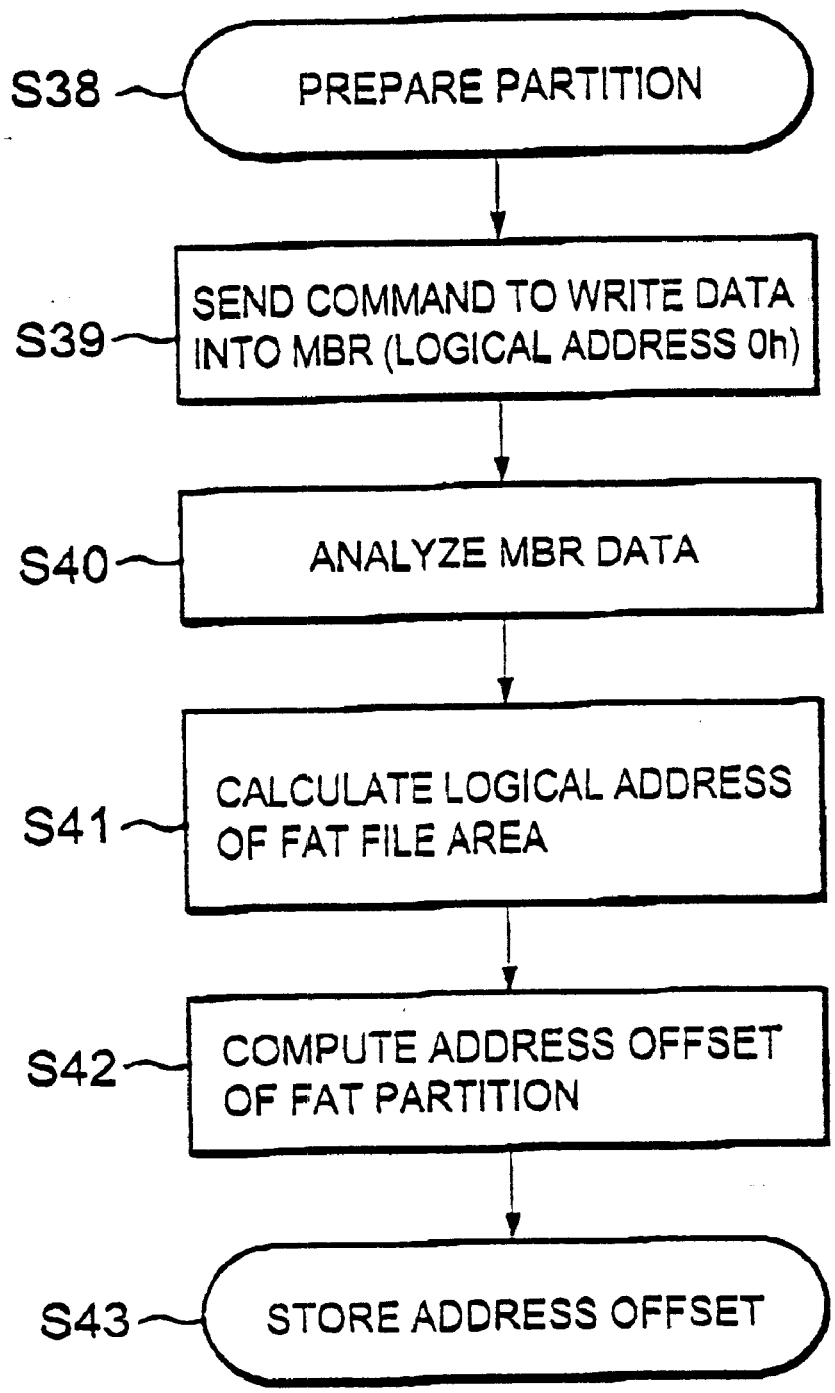
FIG. 8 is a flowchart of a second address offset setting processing.

FIG. 8 is a flowchart of a second address offset setting processing. The second address offset setting processing computes by the use of data an address offset value when the data is written into the MBR 23.

When a new partition is prepared on the flash memory array 18 (S38), the host system 1 writes data including information pertaining to a logical address range of the partition into the MBR 23 having a logical address 0h. Specifically, the host system 1 sends the CPU 6 a command to write data into the logical address 0h (S39).

When the CPU 6 is instructed to write the data into the logical address 0h, the CPU 6 writes data held in the buffer memory 12 into the physical address 0h of the flash memory 17, and reads out the data to analyze the data. Thus, the CPU 6 knows the logical address range of the partition newly prepared (S40). Then, the CPU 6 computes the logical address range occupied by the PBR 26, the FAT area I 27, the FAT area II 28 and the route directory area 29 when this partition is formatted by the FAT, and computes the starting logical address value of the FAT file area 30 (S41).

Then, when a physical address whose value is equal to the starting logical address value does not correspond to a head start sector of the block, the CPU 6 subtracts the starting logical address value from physical address value of a head sector of each block following the block concerned, and computes the address offset value (S42). The CPU 6 allows the address offset storage section 10 to store the computed address offset value therein (S43).

Thereafter, the CPU 6 transforms the logical address within a range occupied by the FAT partition 25 to a physical address having a value obtained by adding the address offset value stored in the address offset storage section 10 to this logical address, and accesses the flash memory 17 using the physical address thus transformed.

Figure 9:
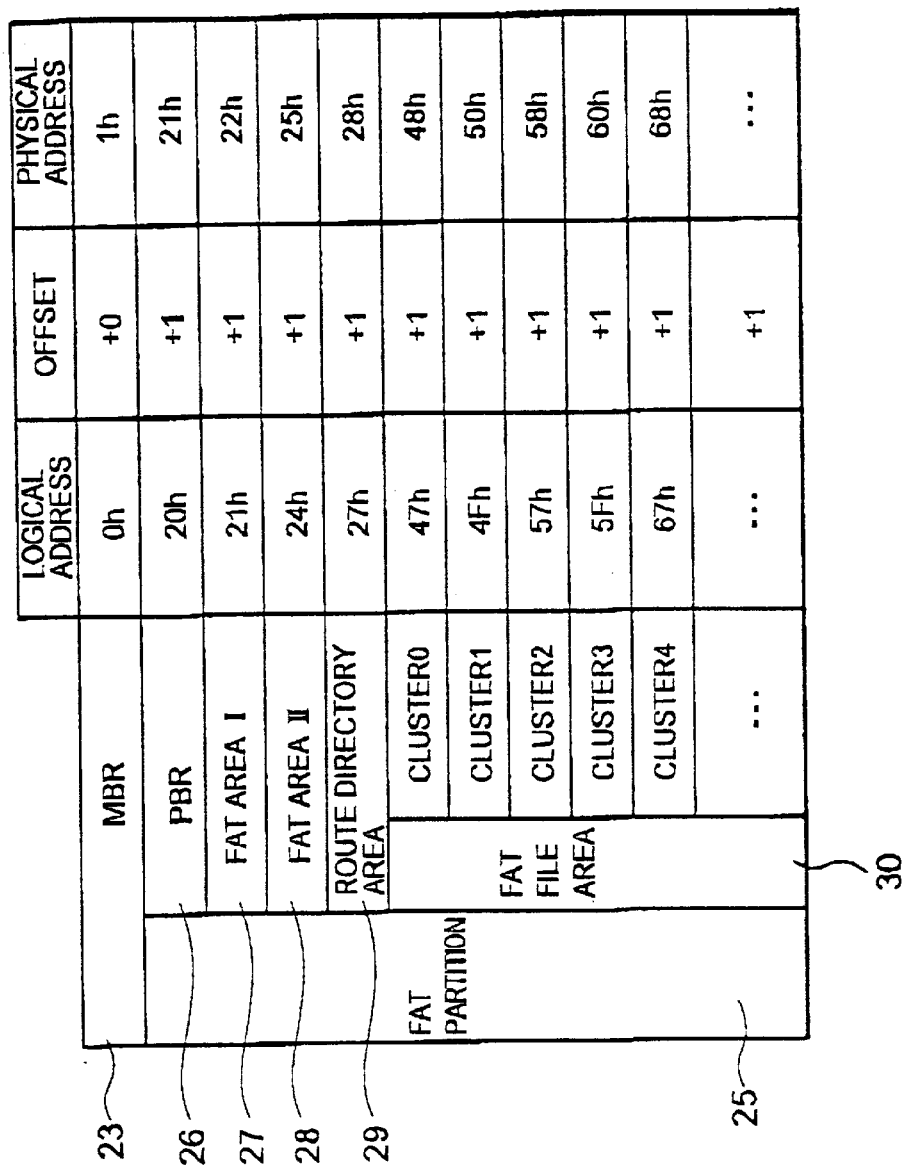
FIG. 9 is a table showing an example of a correspondence correlation between a logical address and a physical address.

FIG. 9 shows an example of correlation between the logical addresses of the head sectors of the MBR 23, the areas 26 to 30 of the FAT partition and the clusters 31, and the physical addresses corresponding to them.

FIG. 9 is identical to FIG. 7 except that the address offset value is not added to the MBR 23. With respect to the range to which the address offset is applied, the address offset value may be applied to any range as long as the address offset value is applied at least to the logical address range occupied by the FAT file area 30. For example, similarly to FIG. 7, data of the MBR 23 may be written into the physical address 1h.

Figure 10:
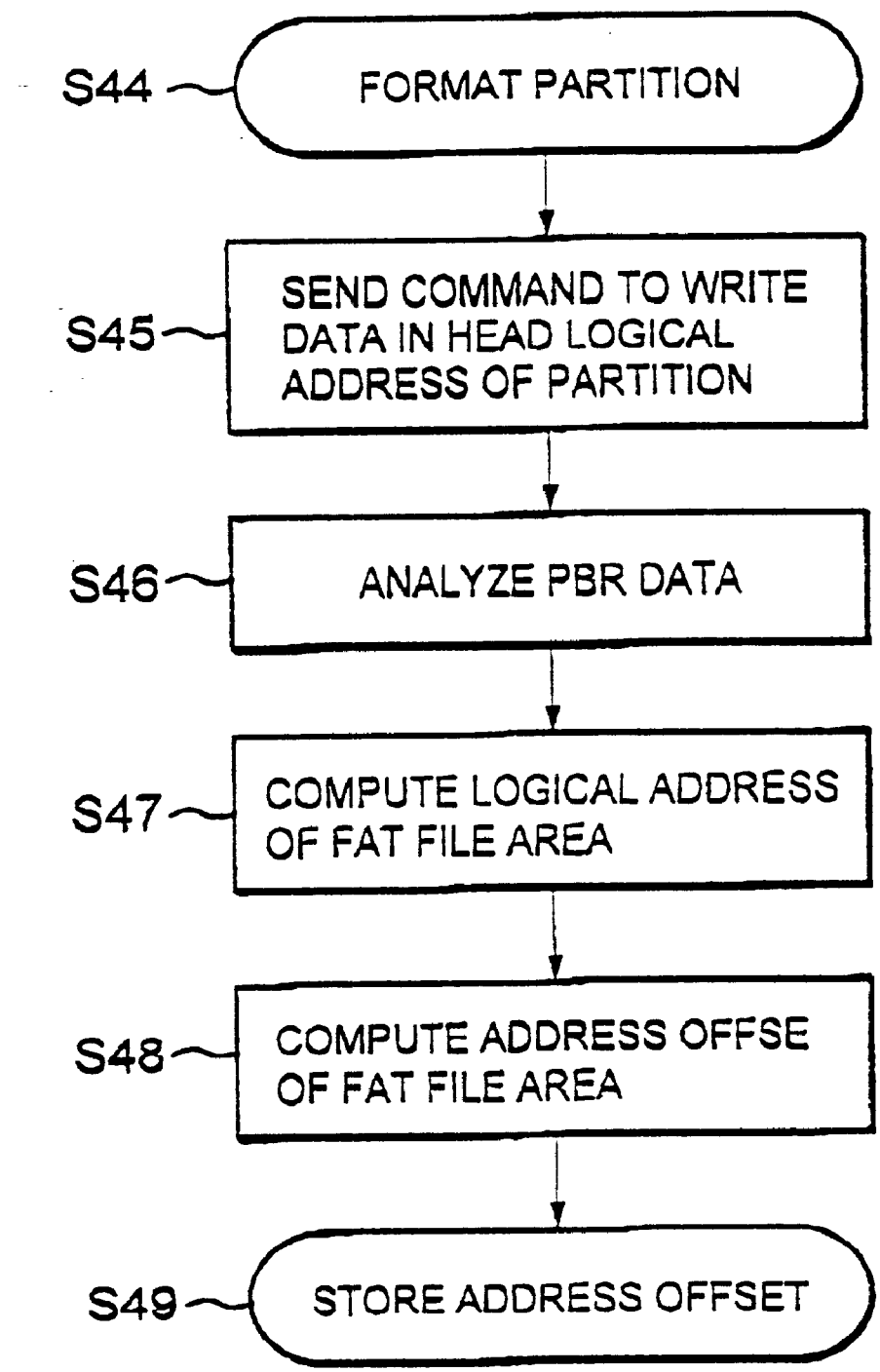
FIG. 10 is a flowchart of a third address offset setting processing.

Furthermore, a third address offset setting processing which is applicable to the present invention will be described. FIG. 10 is a flowchart of the third address offset setting processing. The third address offset setting processing computes the address offset value by the use of the data of the PBR in formatting the partition.

When the host system 1 formats the partition on the flash memory 18 with the FAT (S44), data including information pertaining to the logical address range of each area of the FAT partition is written into the PBR 26 located at the head logical address of the partition (S45).

When a command to write data into a certain logical address is sent from the host system 1 to the semiconductor memory device 100, the CPU 6 checks whether the certain logical address is a head logical address of the partition. As a result of the check, if the certain logical address is the head logical address of the partition, the CPU 6 reads out the data held by the buffer memory 12 and analyzes the read-out data, and checks whether the read-out data is data corresponding to the PBR 26 of the FAT file system (S46).

Thus, when the CPU 6 detects that the partition is formatted with the FAT, the CPU 6 writes the PBR data held by the buffer memory 12 into a physical address whose value is equal to the head logical address value of the partition, and calculates, based on the PBR data, the logical address range occupied by the FAT area I 27, the FAT area II 28 and the route directory area 29, which constitute the FAT partition 25, thus computing a starting logical address value of the FAT file area 30 (S47).

Then, if a physical address whose value is equal to the computed starting logical address value is not a head address of a block, the CPU 6 subtracts the starting logical address value from a physical address value of a head sector of each block following the block concerned, and computes an address offset value (S48), thus allowing the address offset storage section 10 to store the computed address offset value therein (S49).

Thereafter, the CPU 6 transforms the logical address within a range occupied by the FAT partition 30 to a physical address having a value obtained by adding the offset address value stored in the address offset storage section 10 to this logical address, and accesses the flash memory 17 using the physical address thus transformed.

Figure 11:
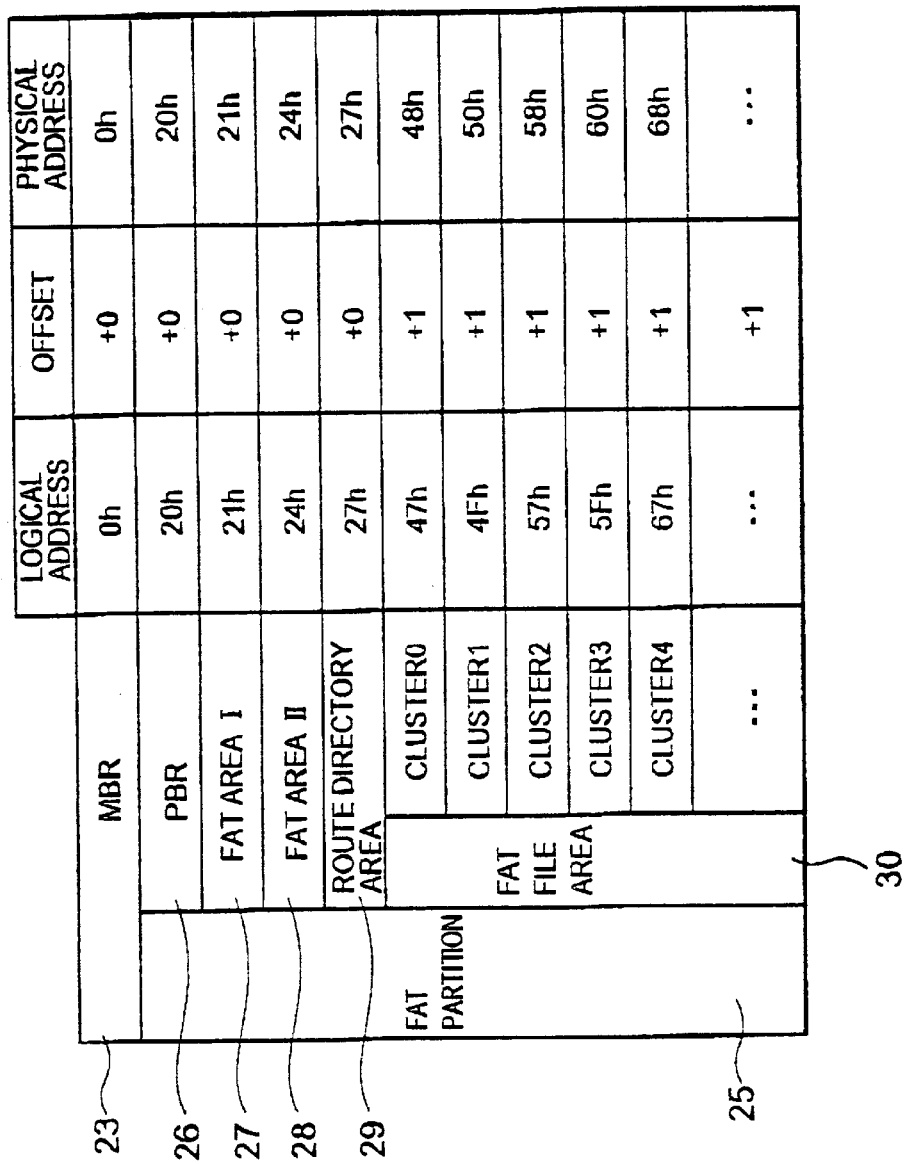
FIG. 11 is a table showing an example of a correlation between a logical address and a physical address.

FIG. 11 shows an example of correlation between logical addresses of the head sectors of the MBR 23, the areas 26 to 30 of the FAT partition and the clusters 31, and physical addresses corresponding to them.

As shown in FIG. 11, in this case, the address offset value is applied only to the logical address range occupied by the FAT file area 30. Note that the address offset value may be applied to other areas, for example, an area ranging from the PBR area 26, as shown in FIG. 9.

In the above descriptions, the CPU 6 in the semiconductor memory device 100 performs the computation of the address offset value, the address transformation and the like. However, a CPU outside the semiconductor memory device may perform a part of these functions or all of these functions.

Figure 12:
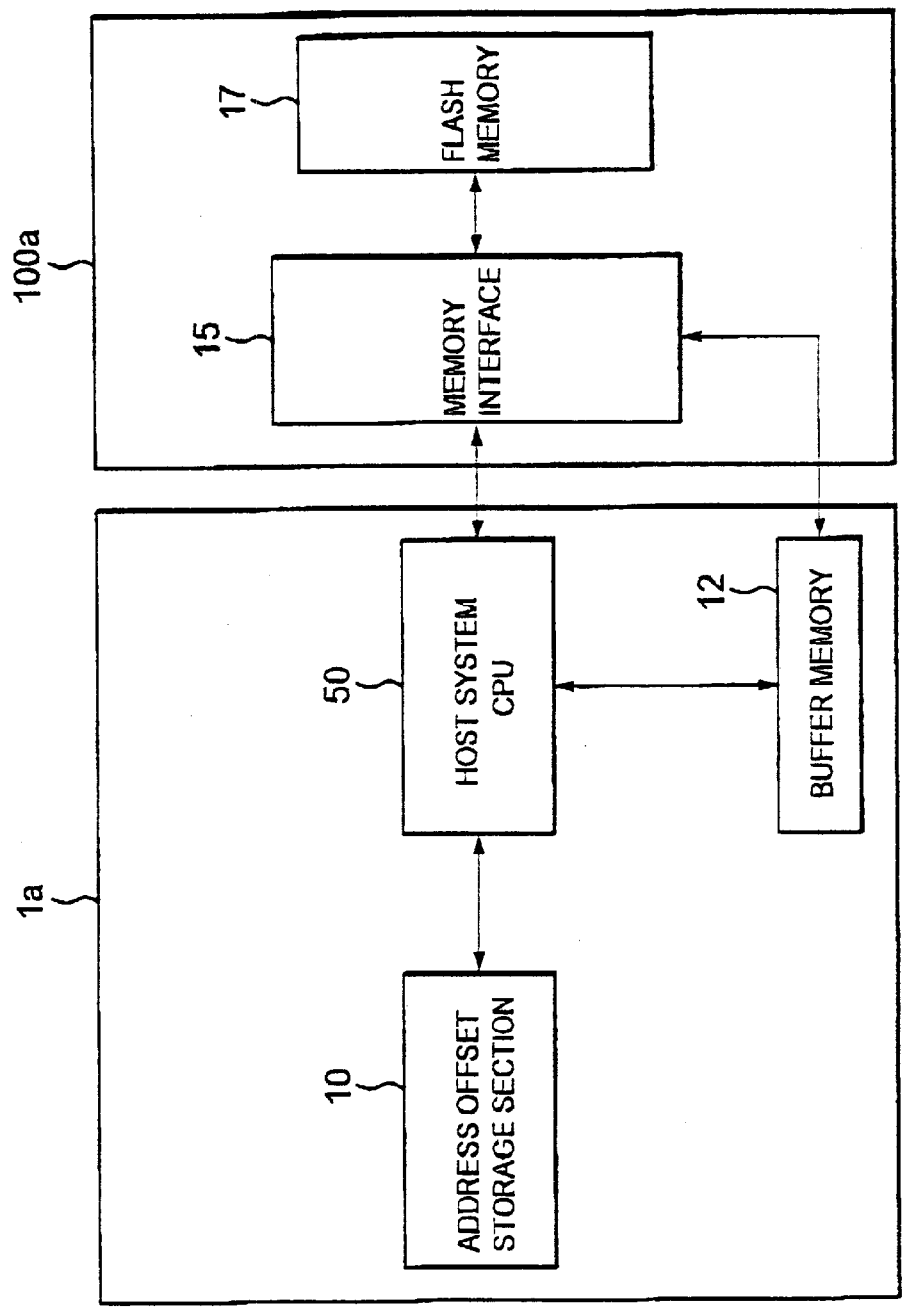
FIG. 12 is a block diagram showing a semiconductor memory device and a host system.

FIG. 12 is a block diagram showing constitutions of the semiconductor memory device and the host system in the case where the address transformation is performed in the host system.

As shown in FIG. 12, the host system 1a comprises a host CPU 50, the address offset storage section 10 and the buffer memory 12.

On the other hand, a semiconductor memory device 100a, comprises the memory interface 15 and the flash memory 17. Note that the buffer memory 12 and the like may be provided in the semiconductor memory device 100a.

The CPU 50 of the host system 1a performs a processing identical to that performed by the foregoing CPU 6, and accesses the flash memory 17 in the semiconductor memory device 100a by the use of a physical address that has been undergone the address transformation. Thus, the same effects can be achieved also in the semiconductor memory device 100a as in the foregoing semiconductor memory device 100.

In the above descriptions, though the FAT file system was described as the file data management system, the present invention can be applied to other file systems as long as applied is a file data management system in which a case where a head of unit of a file data area such as a cluster does not coincide with a head of a batch erasable/writable block of a flash memory occurs and in which a logical address occupied by a file data area can be computed by the use of management data.

The memory section constituting the semiconductor memory device according to the present invention is not limited to a flash memory. The memory section may be the one which performs the erasion for each block constituted by two or more sectors in writing data.

As described above, according to the present invention, even when the host system performs writing of file data for each cluster constituted by the plurality of blocks for the semiconductor memory device mounting the memory section in which the erasion/writing is performed for each block constituted by the plurality of sectors, it is possible to reduce the number of erasion times of each block to the minimum, and a reduction of a life of the block can be prevented. In addition, the number of the blocks in which the simultaneous erasion/writing is performed can be reduced to the minimum for one writing, and a processing time required for the writing can be shortened.

What we claimed is:

1. A semiconductor memory device accessible by the use of logical addresses from a host system which divides and manages file data by the use of clusters each of which is composed of a plurality of sectors and is a unit for division and management of the file data, comprising:

a memory section composed of the plurality of sectors, and capable of erasing data stored therein for each block; and a control section for transforming a logical address received by the host system to a physical address so that a logical address of a head sector of said cluster corresponds to a physical address of a head sector of said block, and for accessing the memory section by the use of the physical address thus transformed, wherein said logical address is transformed to said physical address by applying an address offset value to said logical address.

2. The semiconductor memory device in accordance with claim 1, wherein a computation of said address offset value is executed by the use of information concerning total storage capacity of said memory section immediately after starting power supply to the semiconductor memory device.

3. The semiconductor memory device in accordance with claim 1, wherein a computation of said address offset value is executed by the use of information concerning a partition prepared on said memory section.

4. The semiconductor memory device in accordance with claim 3, wherein the computation of said address offset value is executed when the information pertaining to said partition is written.

5. The semiconductor memory device in accordance with claim 4, wherein the information pertaining to said partition is data written into said sector whose logical address is "0" of said logical address.

6. The semiconductor memory device in accordance with claim 1, wherein a computation of said address offset value is executed by the use of managing information used for managing said file data in a file system prepared on said memory section.

7. The semiconductor memory device in accordance with claim 6, wherein the computation of said address offset value is executed when said managing information is written.

8. An information processing device comprising:

the semiconductor memory device in accordance with claim 1.

9. A host system which divides and manages file data using clusters each of which is composed of a plurality of sectors and is a unit for division and management of the file data, wherein in accessing a memory device which is composed of a plurality of sectors and is capable of erasing data for each block, a logical address is transformed to a physical address so that a logical address of a head sector of said cluster corresponds to a physical address of a head sector of said block, and then accesses said memory device by the use of the physical address thus transformed, wherein said logical address is transformed to said physical address by applying an address offset value to said logical address.

* * * * *